(12) United States Patent  
Widdershoven

(10) Patent No.: US 6,765,261 B2
(45) Date of Patent: Jul. 20, 2004

(54) SEMICONDUCTOR DEVICE COMPRISING A NON-VOLATILE MEMORY

(75) Inventor: Franciscus P. Widdershoven, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/520,060

(22) Filed: Mar. 7, 2000

(65) Prior Publication Data

US 2003/0006449 A1 Jan. 9, 2003

(30) Foreign Application Priority Data

Mar. 9, 1999 (EP) .............................................. 99200697

(51) Int. Cl.[7] .......................................... H01L 29/792
(52) U.S. Cl. ................................................... 257/324
(58) Field of Search ................................ 257/314–317, 257/321, 324; 438/258, 263, 216, 261, 591, 593

(56) References Cited

U.S. PATENT DOCUMENTS 4,833,514 A    5/1989  Esquivel et al. .......... 357/23.5
5,262,846 A  * 11/1993  Gill et al. .................... 257/314
5,426,605 A    6/1995  Van Berkel et al. ......... 365/182
5,460,990 A  * 10/1995  Bergemont .................. 438/258
6,191,459 B1 *  2/2001  Hofmann et al. ........... 257/390

FOREIGN PATENT DOCUMENTS

DE      19652547 A    6/1998
WO       9949516 A1   9/1999

* cited by examiner

Primary Examiner—Thien F Tran
(74) Attorney, Agent, or Firm—Peter Zawilski

(57) ABSTRACT

In a non-volatile memory, the word lines (6) are closely spaced without the usual field oxide or trench isolation between adjacent word lines. In a virtual ground embodiment, the surface area of one cell may be reduced thereby to practically $2F^2$, F being the minimum photolithographically-limited process dimension. In a NMOS embodiment, in which a nitride layer (8) is used for storing electric charge representing data, the packing density may be doubled evenly, by storing two bits per cell, thus reducing the area to $F^2$ per bit. This can be achieved by reversing the read current with respect to the write current.

10 Claims, 5 Drawing Sheets

SEMICONDUCTOR DEVICE COMPRISING A NON-VOLATILE MEMORY

BACKGROUND OF THE INVENTION

The invention relates to a semiconductor device comprising a semiconductor body having a surface region of a first conductivity type which borders on a surface and which is provided with a non-volatile memory in the form of a matrix of memory cells which are arranged in rows and columns, each memory cell comprising a MOS transistor having a source, a drain, a channel region situated between the source and the drain, and a gate which is situated above the channel region and which is electrically insulated from said channel region by an intermediate gate dielectric which is provided with a charge-storage region wherein data in the form of electric charge can be stored, each column comprising two zones of the opposite, i.e. the second, conductivity type, which extend throughout the length of the column and which form a common source and drain for the memory cells in the column, and the surface being covered with a number of adjacent word lines in the form of conductor tracks extending over the surface in a direction parallel to the rows, and each word line being coupled to the gates of a row of memory cells. Such devices are generally known in the literature. During writing or programming, electric charge is provided in the charge-storage region, thereby causing the threshold voltage of the transistor to be changed. The cell can be read by applying a voltage to the gate having a value between the threshold voltage of a programmed cell and the threshold voltage of a non-programmed cell, and by subsequently ascertaining whether the transistor is conducting or non-conducting at this gate voltage. The charge-storage region may be formed, for example, by a floating gate. In another embodiment, the charge-storage region is formed by the interface between an oxide layer and a nitride layer in the gate dielectric. In yet another embodiment, the charge-storage region is formed by distributing, for example, small metal particles in the gate dielectric. The matrix may be designed such that each column comprises source/drain zones which are only associated to this column. Preferably however, each zone is shared by two adjacent columns so that, with the exception of course of zones at the edges of the matrix, each zone forms a source or drain of two columns, so that a high packing density can be achieved. In the literature, such a design is commonly referred to as "virtual ground". If F is the minimum dimension which can be imaged photolithographically, then the minimum dimension of the cell according to this design in the direction of the word lines (x-direction) is 2F. In the y-direction, the cells are generally separated from each other by field oxide or an implanted region, so that the minimum dimension of a cell in the column direction (y-direction) is also 2F. This means that, in known devices, the minimum size of a memory cell is $4F^2$.

SUMMARY OF THE INVENTION

It is an object of the invention to provide, inter alias, a method of increasing the packing density particularly in the y-direction, so that, at a minimum photolithographic dimension F, the minimum size of a cell in the y-direction becomes equal, or at least substantially equal to F, so that the minimum size of the cell becomes only $2F^2$. A semiconductor device of the type described in the opening paragraph is characterized in accordance with the invention in that the channel regions of memory cells in two adjacent rows are separated from each other only by intermediate parts of the surface region of the first conductivity type, the distance between these channel regions as well as the distance between the associated word lines being small in comparison with the width of the channel region and the width of the word line, respectively.

The invention is, inter alias, based on the recognition that in a non-volatile memory maximally one word line is selected at any one time, while the other word lines are not selected, so that it is not necessary to separate adjacent channels of adjacent cells from each other by intermediate field oxide or a trench of a channel stop area. This means that, unlike conventional devices in which the space between the channels and the word lines, which has a dimension which is at least equal to the above-mentioned minimum photolithographic dimension F, is used for the isolation between adjacent cells, in a device in accordance with the invention, this space is also used for providing memory cells. By virtue thereof, the packing density in the y-direction can be practically doubled as compared to conventional memories.

Although the invention can be advantageously used in embodiments wherein each column comprises a source and drain zone belonging only to this column, a preferred embodiment is characterized in that the zones of the second conductivity type are shared by two adjacent columns of memory cells. By virtue of the fact that, in these "virtual ground" embodiment, zones are shared by two adjacent columns, a higher packing density in the x-direction can be obtained. In embodiments wherein the charge-storage region in the memory cells is formed by a floating gate, the minimum size of the cell in the x-direction is 2F. A further embodiment of a device in accordance with the invention is characterized in that the charge-storage regions each comprise a collection of mutually separated trapping centers. In such an embodiment electric charge cannot only be provided in the charge-storage region throughout the channel length but also only on the source side of the channel or only the drain side of the channel. Since these different conditions can be distinguished in the reading process, it is possible to store two bits per cell in this type of memories, as described, inter alias, in the patent U.S. Pat. No. 5,426,605 by van Berkel et. al. This mode of operation enables the bit density in the x-direction to be doubled. In combination herewith, the application of the invention enables a programmable, non-volatile memory having a minimum effective cell size of only $F^2$ to be manufactured.

In a semiconductor device in accordance with the invention, the word lines may be closely spaced so as to obtain a high packing density. A further embodiment is characterized in that the word lines include strips of doped polycrystalline silicon which are separated from each other only by thin dielectric layers covering the side walls of the strips. An embodiment in which use can be made of CCD techniques, is characterized in that the word lines are alternately formed in a first, doped polycrystalline silicon layer and a second, doped polycrystalline silicon layer which is electrically insulated from the first layer.

These and other aspects of the invention will be apparent from and elucidated with reference to the embodiments described hereinafter.

DESCRIPTION OF THE PREFERRED EMBODIMENTS

Figure 1:
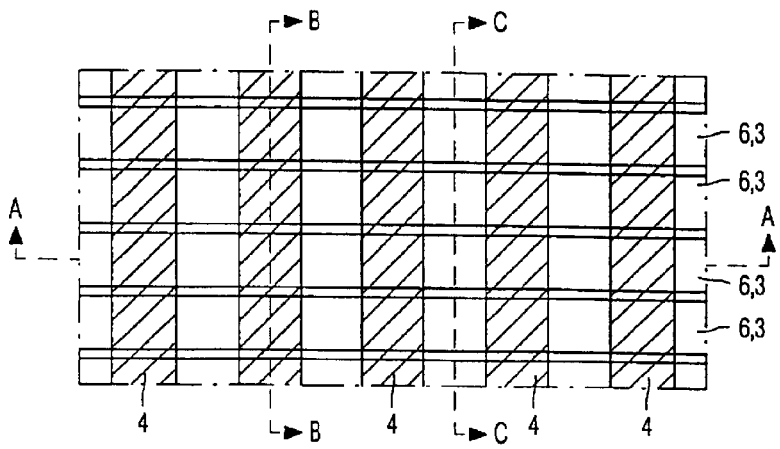
FIG. 1 is a plan view of a semiconductor device in accordance with the invention.
Figure 2A:
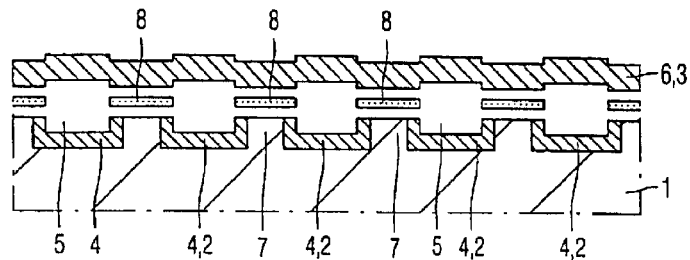
FIG. 2a is a sectional view of this device taken on the line A—A in FIG. 1.
Figure 2B:
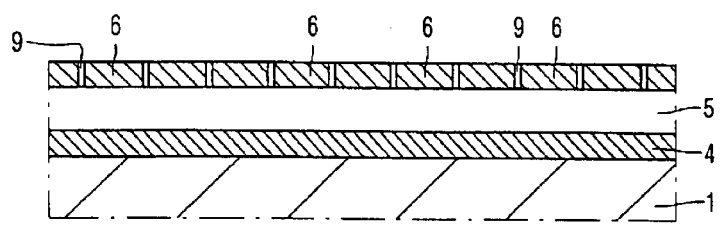
FIG. 2b is a sectional view of this device taken on the line B—B in FIG. 1.
Figure 2C:
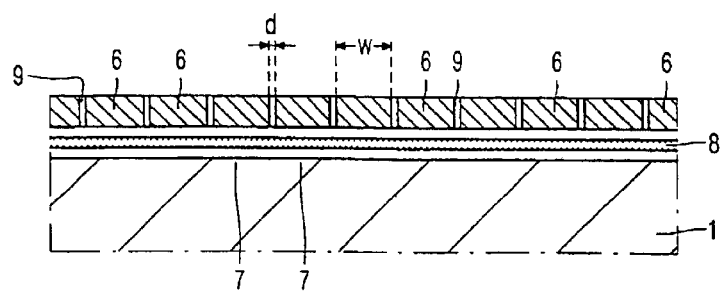
FIG. 2c is a sectional view of this device taken on the line C—C in FIG. 1.
Figure 3:
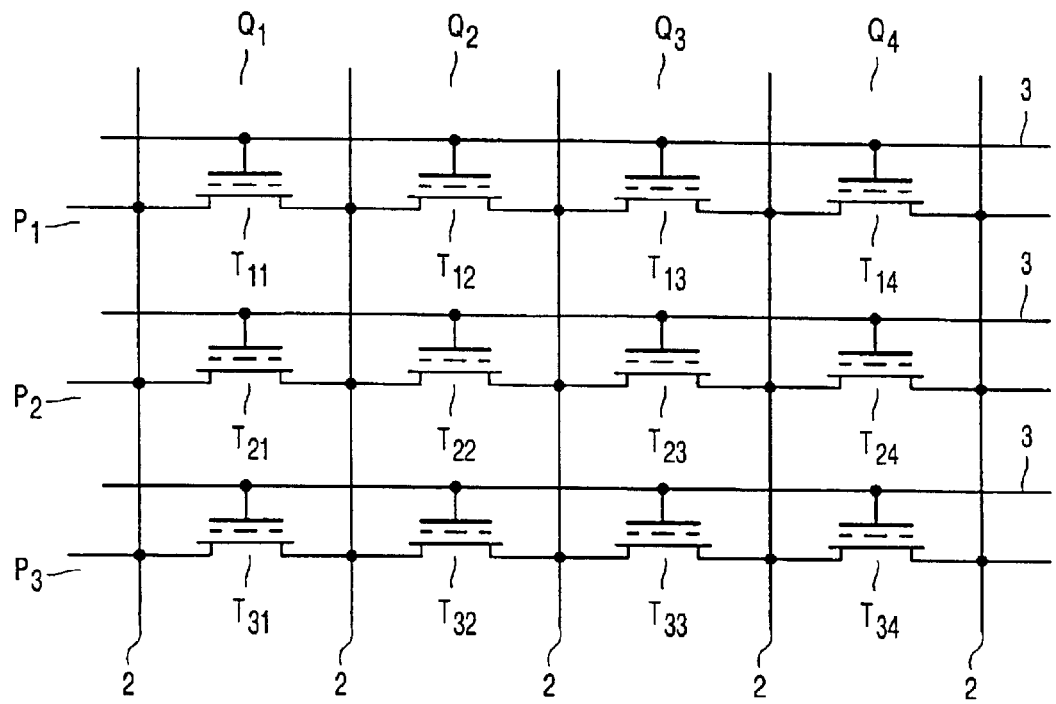
FIG. 3 is an electrical circuit diagram of the device shown in FIG. 1.

Hereinbelow, the invention will be described by means of a non-volatile memory. It will be very clear from the description that the invention is not limited to so-called "stand-alone" memories, and that the invention can also advantageously be used in integrated circuits having an "embedded" memory, wherein, for example, apart from the memory also signal-processing circuits are formed in the semiconductor body, for example by means of a standard CMOS process. The device, which is partly shown in FIG. 1 and FIG. 2, comprises a semiconductor body of, for example, silicon having a surface region 1, in this example a p-type surface region, which borders on a surface. As indicated in the diagram of FIG. 3, the memory is built up of a matrix of memory cells arranged in rows $P_1$, $P_2$, $P_3$, etc., and columns $Q_1$, $Q_2$, $Q_3$, etc. Each memory cell comprises a MOS transistor $T_{ij}$, where the index i indicates the row number and the index j indicates the column number. The sources and the drains of the transistors of a column are connected to bit lines 2. In the present example, each line 2 (with the exception of course of the columns along the edge of the matrix, which are not shown in the drawing) is a bit line which is shared by two adjacent columns. In the literature, such a construction is commonly referred to as "virtual ground configuration". The gates of the transistors $T_{ij}$ in a row are connected to a word line 3. Between the gates of the transistors and the underlying channels, charge-storage regions are formed, indicated by interrupted lines in FIG. 3, on which electric charge can be stored as data, which, as is generally known, determines the threshold voltage of the transistors. As shown in FIG. 1 and FIG. 2, the bit lines are formed by elongated n-type surface zones 4 which form common sources and drains of the MOS transistors of a column, said surface zones being arranged in the p-type surface region 1. In addition, each zone 4 constitutes a zone shared by two adjacent columns in accordance with the virtual ground principle. The zones 4 are covered with a relatively thick dielectric layer 5, in this example silicon oxide, which electrically insulate the zones 4 (bit lines 2) from the polycrystalline silicon paths 6 which form the word lines 3 in FIG. 3. The surface parts 7 of the semiconductor body 1 between the zones 4 form the channel regions of the transistors $T_{ij}$. The regions 7 are separated from the word lines 6 by a relatively thin gate dielectric which comprises a charge-storage region 8 on which electric charge can be stored which determines the threshold voltage of the transistor. In this example, the charge-storage region is formed by providing, in the oxide layer above the channel regions 7, a layer 8 of silicon nitride, hereinafter referred to as nitride for short, whereby at the interface between the nitride layer 8 and the oxide, a distribution of trapping centers is present, as is well known, wherein electrons can be trapped and stored. In the example shown in the drawing, the nitride layer is provided in the form of elongated strips which extend, over the matrix, parallel to the zones 4 and, viewed on the surface, between the zones 4. Patterns other than those shown here are also possible of course. For example, the nitride strips 8 may extend parallel too, and below, the word lines 6. The nitride layer 8 may alternatively be provided as a coherent layer which extends over the entire matrix. The gates of the transistors are formed by the parts of the word lines 6 which are situated above the channel regions 7. As shown in the plan view in accordance with FIG. 1, and in the sectional view in accordance with FIG. 2c, the channel regions 7 of adjacent rows are not separated from each other in the customary manner by field oxide, grooves or channel-stop areas, but only by narrow intermediate parts 9 of the p-type surface region 1, the distance d between the channels/word lines being small in comparison with the width w of the channel regions/word lines. In a specific process in which the width of the word lines is, for example, 0.5 μm, which in the present process corresponds to the minimum size yet to be imaged, the distance between the rows can be reduced to several tens of nm by virtue of the absence of field isolation in the matrix. This means that, in the column direction (y-direction), the size of the cell almost corresponds to the minimum size to be imaged.

Figure 4:
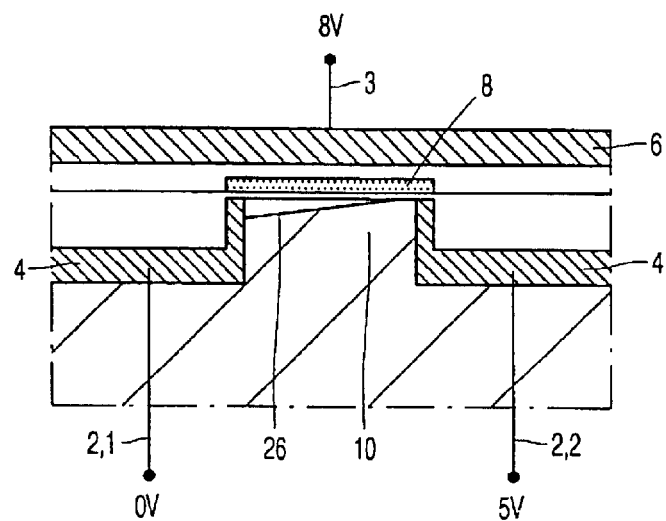
FIG. 4 is a sectional view of a memory cell of this device.

The writing process may be carried out by channel-injection of hot electrons (CHEI or channel hot electron injection). To illustrate the writing process, FIG. 4 diagrammatically shows a random cell, for example a transistor $T_{23}$, to which voltages are applied. The transistor is rendered conducting by applying a positive voltage of, for example 8 V, to the word line (control gate) 6 and a low voltage of, for example 0 V, to the left bit line 2, thus causing a channel 26 to be induced in the channel region, said left bit line serving as a source and being provided with the reference numeral 2,1 so as to distinguish it from the right bit line 2,2 which forms the drain. A positive voltage of, for example 5 V, is applied to the drain, i.e. bit line 2,2. A channel current runs in the channel 26, hot electrons being formed at a point 10 near the drain by the high electric field, said hot electrons having sufficient energy to go past the gate oxide below the nitride layer 8 and be stored in trapping centers at the interface between the nitride and the oxide. This trapped electric charge causes the threshold voltage to be locally increased. To preclude that other cells in the same row are simultaneously written, a voltage of 0 V may be applied to the bit lines to the left of the bit line 2,1, and a voltage of 5 V may be applied to the bit lines to the right of the bit line 2,2, so that no channel current can flow in the non-selected cells of the row.

The cell can be read in a customary manner. For this purpose, a gate voltage of, for example, 3 V is applied again to the word line 6, while a voltage of 0 V and 1 V, respectively, is applied to the source 2,1 and the drain 2,2. By determining the drain current, the threshold voltage of the transistor and hence the presence or absence of electric charge in the gate dielectric can be determined.

Figure 5:
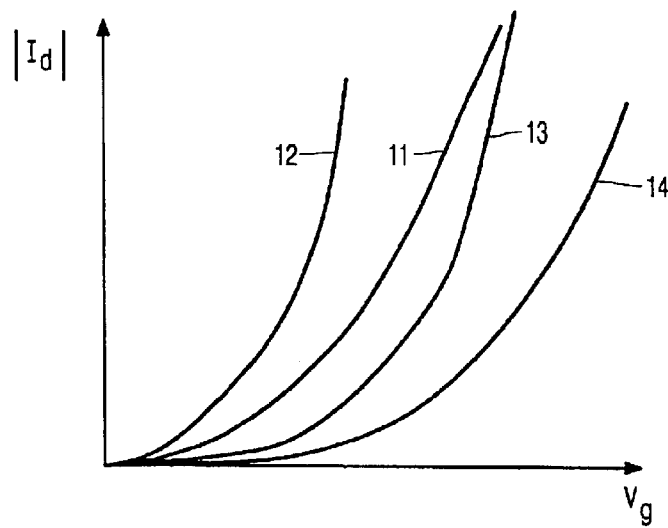
FIG. 5 is a I-V diagram of this cell in different programmed states.

As noted hereinabove, the size of the cell in the y-direction can be practically reduced to F, F being the minimum dimension that can be imaged. In the x-direction, each cell comprises a half source zone and a half drain zone (these zones are shared by adjacent columns) and an intermediate channel region. As a result, the minimum size of the cell in the x-direction amounts to 2F and hence the cell surface area to $2F^2$. By storing two bits per cell, the cell surface area per bit can be reduced to $F^2$. For this purpose, use can be made of a mode of operation as described, inter alias, in the above-mentioned patent U.S. Pat. No. 5,426,605. The description is based on a programmed cell as described with reference to FIG. 4. If a positive voltage of, for example, 1.5 V is applied to the drain, the source being grounded, then the drain current $I_d$ as a function of the gate voltage $V_g$ increases in accordance with curve 11 in FIG. 5. This Figure shows the relation between the drain current $I_d$ (vertical axis) and the gate voltage $V_g$ (horizontal axis for various states of the cell). Curve 12 shows the drain current of the non-programmed cell. In the programmed state, the drain current is lower than in the non-programmed state because, as a result of the higher threshold voltage, saturation of the transistor occurs at a lower drain voltage. When the current direction in the transistor of a programmed cell is reversed, the drain being grounded and a voltage of 1.5 V being applied to the source, the drain current changes as a function of the gate voltage in accordance with curve 13. This situation is identical to the case in which the functions of source and drain are exchanged during writing, causing electrons to be stored on the side of the source, so that, in principle, the same curve as curve 12 is obtained yet shifted over a distance $\Delta V_t$, the quantity $\Delta V_t$ representing the change of the threshold voltage. Curve 14 shows the drain current in the case where electric charge is stored both on the source side and on the drain side of the channel. The above shows that it is possible to distinguish four states in the cell, i.e. no charge in the charge-storage region, charge only on the drain side, charge only on the source side, and charge on either side of the channel. The different states can be written by choosing the current direction during writing. By virtue thereof it is possible to store two bits per cell, so that the minimum size of the cell in the x-direction can also be effectively reduced to the minimum size F to be imaged, as a result of which the surface area per cell is reduced to substantially $F^2$.

Figure 6:
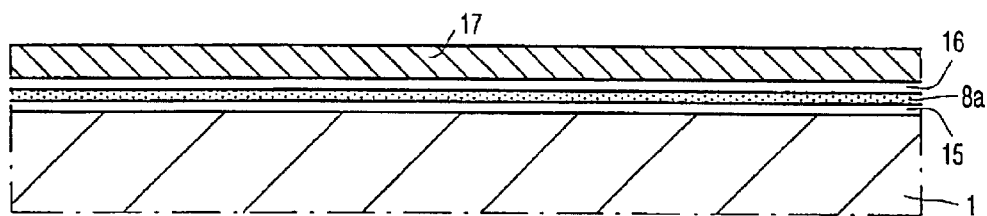
FIGS. 6–9 are sectional views of a semiconductor device in accordance with the invention, manufactured by means of a first manufacturing method, at different stages in the manufacturing process.
Figure 7:
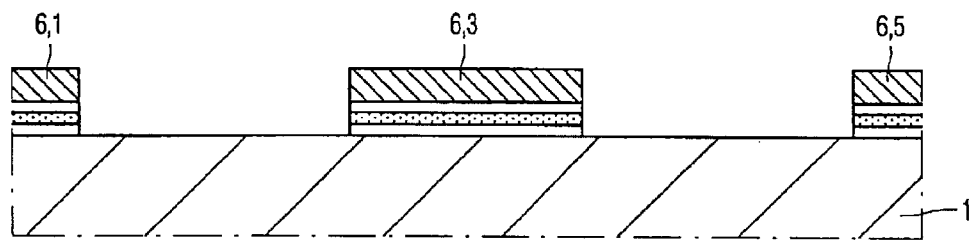
Figure 8:
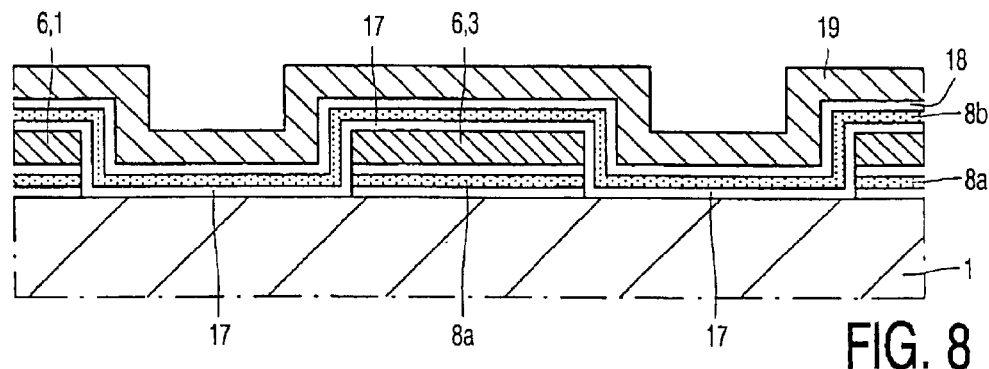
Figure 9:
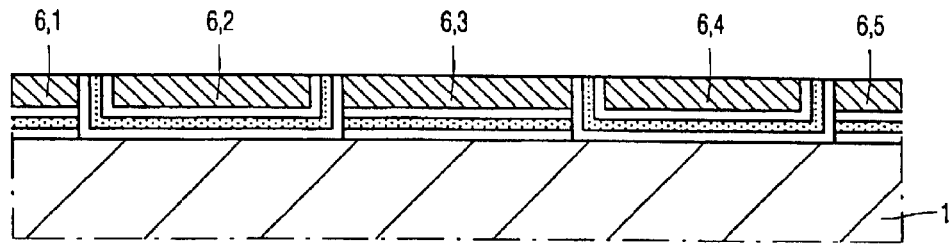

By means of FIGS. 6–9, a few steps in the manufacture of a device in accordance with the invention are described. These Figures show sectional views of the device corresponding to the sectional view shown in FIG. 2a. In the following description, it is assumed that various process steps, such as the provision of the source/drain zones 4 (bit lines) in the semiconductor body 1 have already been carried out. FIG. 6 shows a stage where a first layer 15 of silicon oxide, a layer 8a of silicon nitride and a second layer 16 of silicon oxide are applied to the surface. A layer of polycrystalline silicon, hereinafter referred to as poly I, is deposited on the layer 16, said poly I having been rendered electrically conducting by doping with, for example, As. In a customary photolithographic manner, tracks are formed in the poly layer 17, which form one half of the word lines 6, for example the word lines with an odd sequential number, see FIG. 7, which paths are therefore provided with the reference numerals 6,1; 6,3; 6,5 etc. In a customary manner, also the nitride layer 8a and the oxide layers 15 and 16 are provided with a corresponding pattern. In the interspaces between the word lines 6,1; 6,3; 6,5, new gate oxide 17 is grown in a thickness which is equal to, or at least substantially equal to the thickness of the layer 15 by means of thermal oxidation. At the same time, oxide is grown on the exposed parts of the poly word lines 6. Subsequently, for example by means of CVD techniques, a second nitride layer 8b and an oxide layer 18 are provided. The thicknesses of the nitride layer 8b and the oxide layer 18 correspond as much as possible to the thicknesses of, respectively, the nitride layer 8a and the oxide layer 16. Next, a second doped poly layer 19 (poly II) is provided in a customary manner in a thickness such that the recesses between the word lines 6,1; 6,3; 6,5 are filled completely or at least substantially completely, see FIG. 8. By means of, for example, CMP (chemico-mechanical polishing), which is at least continued until the poly layer 19 above the word lines 6 in the poly I has been removed, the word lines with an even sequential number, i.e. the lines 6,2; 6,4 etc., are formed from the poly layer 19. In the present example, the CMP treatment is continued until the oxide layer 17 above the poly I paths has been removed, so that the situation shown in FIG. 9 is obtained. The word lines 6 are separated from each other by the dielectric layers 17, 8b, 18, whose overall thickness may amount to, for example, 20 nm (?), which is much less than the minimum size to be imaged in the currently used standard processes which, in a specific process, amount to, for example, 300 nm. The device may subsequently be subjected to further customary treatments. If necessary, an implantation step using, for example, As ions may be carried out. In this case, also undoped poly I and poly II layers may be applied and provided with a pattern.

Figure 10:
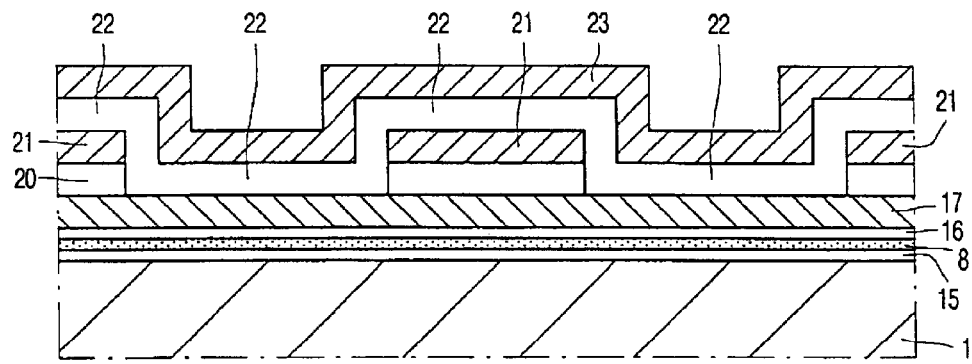
FIGS. 10–14 are sectional views of a semiconductor device in accordance with the invention, manufactured by means of a second manufacturing method, at different stages in the manufacturing process.
Figure 11:
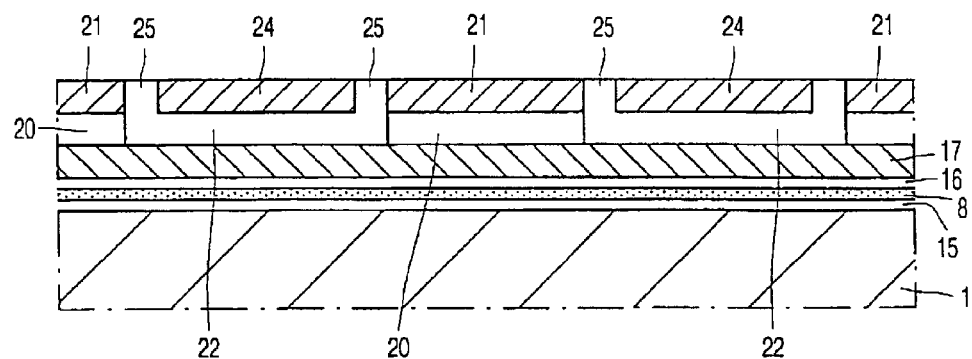
Figure 12:
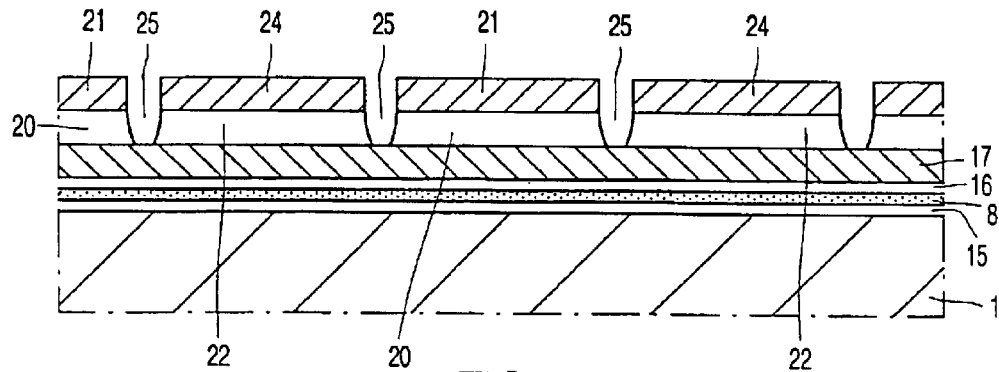
Figure 13:
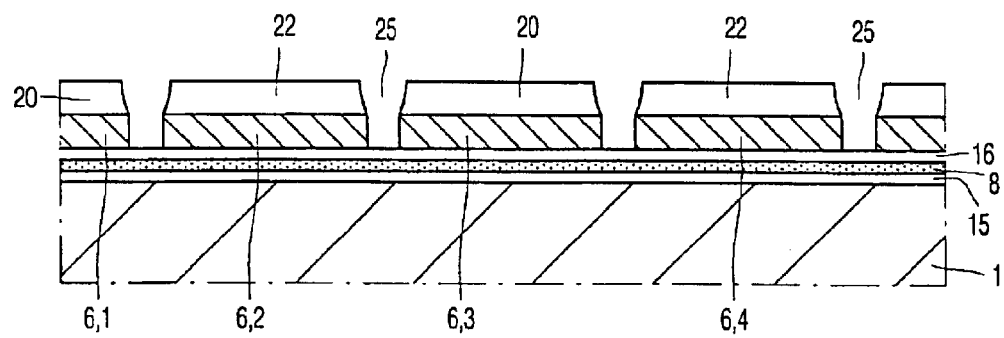
Figure 14:
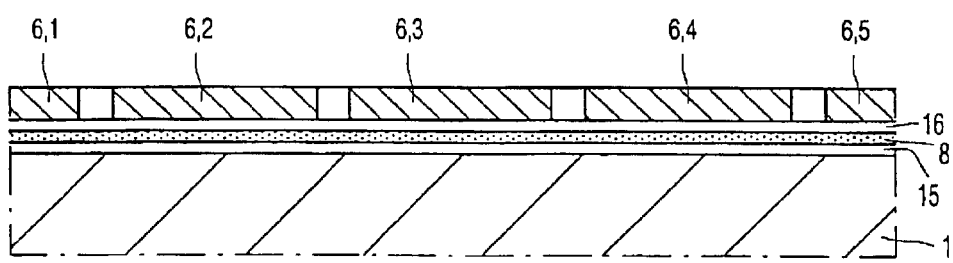

In the process described herein, the gate dielectrics below the poly I paths and below the poly II paths are provided in different process steps. With reference to FIGS. 10–13, a description is given of a method in which, by means of a few additional layers, the gate dielectrics below the even word lines and below the odd word lines are formed in the same process steps. FIG. 10 shows a stage where the surface of the silicon body 1 is covered with an oxide layer 15, a nitride layer 8 and a second oxide layer 16 on which the poly I layer 17 is deposited, which is analogous to the situation shown in FIG. 6. Unlike the preceding example, in this stage, the poly I layer 17 is not patterned but covered with an auxiliary layer 20 of a material which can be selectively etched with respect to poly, in this example silicon oxide. Of course, the layer 20 may alternatively be composed of a different material which is known per se. By means of deposition and photolithography, the oxide layer 20 is subsequently provided with a pattern 21 of poly paths at locations where, at a later stage, the word lines with an odd sequential number are formed. The parts of the oxide layer 20 which are not covered with the poly paths 21 are removed. The poly paths 21 are covered with layer 22 of, for example, silicon oxide, whereafter, for example by means of CVD, a poly layer 23 is applied to the whole. The device at this stage of the process is shown in FIG. 10. By means of, for example, CMP, the parts of the layers 22 and 23 above the poly paths 21 are removed, so that the structure shown in FIG. 11 is obtained, in which poly paths 21 alternate with poly paths 24 formed from the poly layer 23. The paths 21 and 24 are separated from each other by narrow openings 25 whose width is determined by the thickness of the oxide layer 22 which is, for example 20 nm. By means of anisotropic etching, the oxides in the openings 25 and in the underlying parts of the oxide layer 22 are selectively removed with respect to polysilicon, so that the stage shown in FIG. 12 is obtained. The oxide layer 22, which is provided with narrow openings 25, forms a mask for the next anisotropic etch step in which the poly layer 17 is patterned via the openings 25, see FIG. 13. During this etch treatment, the poly paths 21 and 24 are also removed. In the poly layer 17, the word lines 6,1; 6,2; 6,3; 6,4 etc. are formed which are separated from each other by narrow openings having a width of approximately 20 nm. In a next step (FIG. 14) the openings between the word lines 6 are filled, for example, with silicon oxide and, for example, the parts of the oxide layers 20, 22 still present are removed, for example, by polishing. If necessary, a dopant, for example As, may be added to the poly material at this stage.

It will be obvious that the invention is not limited to the examples described herein, and that within the scope of the invention many variations are possible to those skilled in the art. In a modification of the examples described herein, the charge-storage regions in the gate dielectric are formed by a layer of a conductive material, in particular polysilicon, which forms a floating gate. Unlike embodiments in which a silicon nitride layer is used for the charge-storage regions, the floating gates, which must be electrically insulated with respect to each other, do not form a coherent region but separate regions which are each entirely surrounded by electrically insulating material. In addition, in this embodiment the minimum effective cell size may not become smaller than $2F^2$ because in this case no distinction can be made between charge storage on the source side and the drain side of the channel. In a further embodiment, the charge-storage regions are formed by distributing contaminations, for example metal particles, in the gate dielectric.

What is claimed is:

1. A semiconductor device comprising a semiconductor body having a surface region of a first conductivity type which borders on a surface and which is provided with a non-volatile memory in the form of a matrix of memory cells which are arranged in rows and columns, each memory cell comprising a MOS transistor having a source, a drain, a channel region situated between the source and the drain, and a gate which is situated above the channel region and which is electrically insulated from said channel region by an intermediate gate dielectric which is provided with a charge-storage region wherein data in the form of electric charge can be stored, each column comprising two zones of the opposite, second, conductivity type, which extend throughout the length of the column and which form a common source and drain for the memory cells in the column such that one memory cell is formed between every pair of source and drain lines in each row of memory cells, and the surface being covered with a number of adjacent word lines in the form of conductor tracks extending over the surface in a direction parallel to the rows, and each word line being coupled to the gates of row of memory cells, characterized in that the channel regions of memory cells in two adjacent rows are separated from each other only by intermediate parts of the surface region of the first conductivity type, the distance between these channel regions as well as the distance between the associated word lines being small in comparison with the width of the channel region and the width of the word line which has a minimum photolithographic dimension F, respectively, wherein at a minimum photolithographic dimension F, the minimum size of a cell is approximately $2F^2$.

2. A semiconductor device as claimed in claim 1, characterized in that the zones of the second conductivity type are shared by two adjacent columns of memory cells.

3. A semiconductor device as claimed in claim 1, characterized in that the charge-storage region are each formed by a layer of a conductive material which is provided between the gate of the transistor and the channel region and which is surrounded on all sides by an electrically insulating material and form a floating gate.

4. A semiconductor device as claimed in claim 1, characterized in that charge-storage regions each comprise a collection of mutually separated trapping centers.

5. A semiconductor device as claimed in claim 4, characterized in that the gate dielectric comprises a double layer of two different materials which form a border layer which supplies said trapping centers.

6. A semiconductor device as claimed in claim 5, characterized in that the double layer is formed by a layer of silicon oxide and an adjacent layer of silicon nitride.

7. A semiconductor device as claimed in claim 4, characterized in that, for the purpose of writing data, means for forming high-energy electrons in the channel region are present.

8. A semiconductor device as claimed in claim 7, characterized in that means are present for selecting, in each memory cell, the location of the trapping centers where an electric charge is stored.

9. A semiconductor device as claimed in claim 1, characterized in that the word lines include strips of doped polycrystalline silicon which are separated from each other only by thin dielectric layers covering the side walls of the strips.

10. A semiconductor device as claimed in claim 9, characterized in that the word lines are alternately formed in a first, doped polycrystalline silicon layer and a second, doped polycrystalline silicon layer which is electrically insulated from the first layer.

* * * * *